(12) United States Patent
Barile et al.

(10) Patent No.: US 7,064,951 B2
(45) Date of Patent: Jun. 20, 2006

(54) SPACE EFFECTIVE STRUCTURE AND METHOD FOR RETAINING PRINTED CIRCUIT BOARDS WITHIN A HOUSING

(75) Inventors: Dawn M. Barile, Solon, OH (US); Michael S. Baran, Milwaukee, WI (US)

(73) Assignee: Rockwell Automation Technologies, Inc., Mayfield Heights, OH (US)

( * ) Notice: Subject to any disclaimer, the term of this patent is extended or adjusted under 35 U.S.C. 154(b) by 0 days.

(21) Appl. No.: 10/879,667

(22) Filed: Jun. 29, 2004

(65) Prior Publication Data

US 2005/0286237 A1    Dec. 29, 2005

(51) Int. Cl.
*G06F 1/16* (2006.01)
(52) U.S. Cl. .................. 361/679; 361/730; 248/917; 439/501
(58) Field of Classification Search ........ 248/917–920; 439/501, 609; 361/728.73, 679–687, 724–727; 385/92
See application file for complete search history.

(56) References Cited

U.S. PATENT DOCUMENTS

| 6,206,730 | B1* | 3/2001 | Avery et al. | 439/609 |
| 6,324,054 | B1* | 11/2001 | Chee et al. | 361/685 |
| 6,893,168 | B1* | 5/2005 | Huang et al. | 385/92 |
| 2005/0026495 | A1* | 2/2005 | Zoller | 439/501 |

* cited by examiner

*Primary Examiner*—Hung Van Duong
(74) *Attorney, Agent, or Firm*—Steven M. Haas; R. Scott Speroff

(57) ABSTRACT

An enclosure housing has a first wall defined as a molded polymeric construction, a first latch defined as a one-piece construction with the first wall, a second wall defined as a molded polymeric construction, and a second latch defined as a one-piece construction with the second wall. A circuit board is connected to the enclosure housing and includes a board member defined by a periphery. The periphery includes: (i) a first tab defined by a first inclined ramp surface and a first locking face that lies transverse to the first inclined ramp surface, wherein the first tab is engaged with the first latch; and, (ii) a second tab defined by a second inclined ramp surface and a second locking face that lies transverse to the second inclined ramp surface, wherein the second tab is engaged with the second latch.

12 Claims, 7 Drawing Sheets

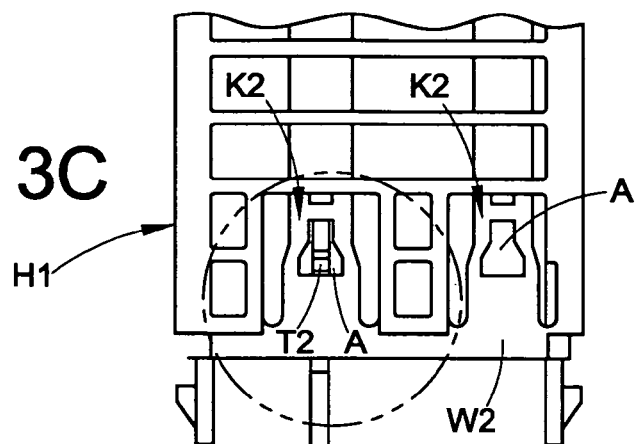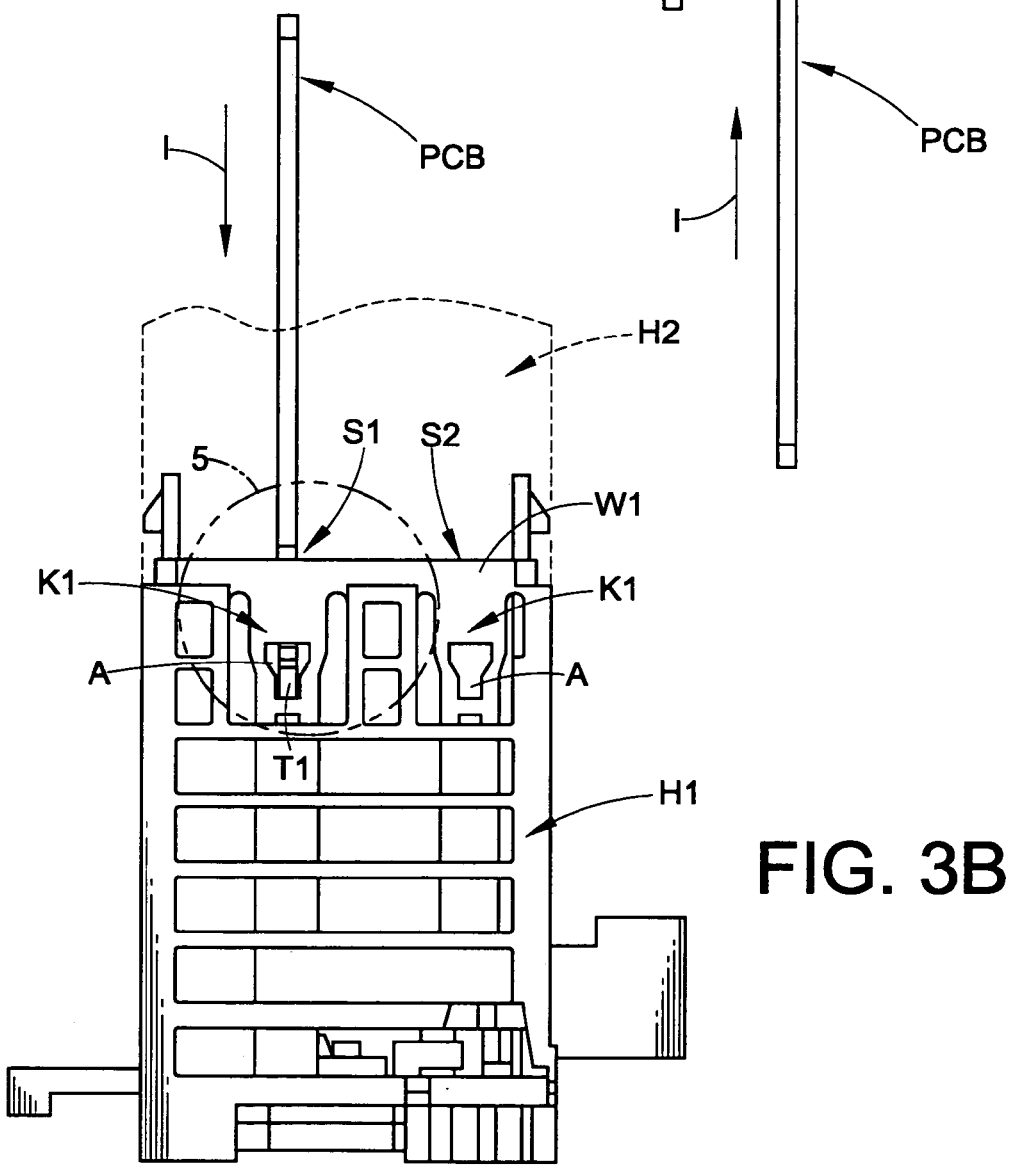

US 7,064,951 B2

SPACE EFFECTIVE STRUCTURE AND METHOD FOR RETAINING PRINTED CIRCUIT BOARDS WITHIN A HOUSING

BACKGROUND

As products including printed circuit boards shrink in size, the space available on a printed circuit board becomes more scarce and valuable. The most valuable space on a printed circuit board is the contiguous area defined within the peripheral outline of the board. Known methods for retaining printed circuit boards within a product enclosure typically require use of fasteners or snap-legs in the housing that engage portions of the valuable contiguous area described above. As such, portions of the contiguous area are deemed "keepouts" and/or require placement of holes in locations that could otherwise be used for component placement and/or traces that electrically interconnect components. Aside from the need to allow for keepouts, snap-fit assemblies are otherwise desirable in that the snap-legs are integrally molded into the enclosure housing and reduce part-count and labor content. Unfortunately, known snap-fit methods and structures for printed circuit board installation have exhibited susceptibility to dislodgement of the printed circuit board under harsh conditions such as shock and vibration often encountered in an industrial environment. With the foregoing considerations in mind, it has been deemed desirable to provide a space effective structure and method for retaining printed circuit boards within a housing in order to maximize the usable area on a printed circuit board in an economical and effective manner.

SUMMARY

In accordance with a first aspect of the present development, an enclosure housing portion adapted to receive and retain a circuit board includes a first side wall; a first latch defined as a one-piece construction with the first side wall, the first latch including an aperture adapted to receive a first projecting tab of an associated circuit board inserted into the housing portion.

In accordance with another aspect of the present development, a circuit board includes a planar board member defined by a peripheral edge. The peripheral edge includes a front edge; first and second parallel spaced-apart lateral edges that extend transversely relative to the front edge; a first projecting tab defined by a first inclined ramp surface and a first locking face that terminates and lies transverse to the first inclined ramp surface.

In accordance with a further aspect of the development, an enclosure housing portion includes a first side wall defined as a molded polymeric construction; a first latch defined as a one-piece construction with the first side wall; a second side wall defined as a molded polymeric construction; a second latch defined as a one-piece construction with the second side wall; a circuit board connected to the enclosure housing portion, the circuit board comprising a planar board member defined by a peripheral edge. The peripheral edge includes: (i) a first projecting tab defined by a first inclined ramp surface and a first locking face that lies transverse to the first inclined ramp surface, wherein the first projecting tab is engaged with the first latch; and, (ii) a second projecting tab defined by a second inclined ramp surface and a second locking face that lies transverse to the second inclined ramp surface, wherein the second projecting tab is engaged with said second latch.

BRIEF DESCRIPTION OF THE DRAWINGS

The development is described herein with reference to the accompanying drawings that form a part hereof and wherein:

FIG. 3B is a plan view taken along line 3B—3B of FIG. 2;

FIG. 3C is a partial plan view taken along line 3C—3C of FIG. 2;

DETAILED DESCRIPTION

Figure 1:
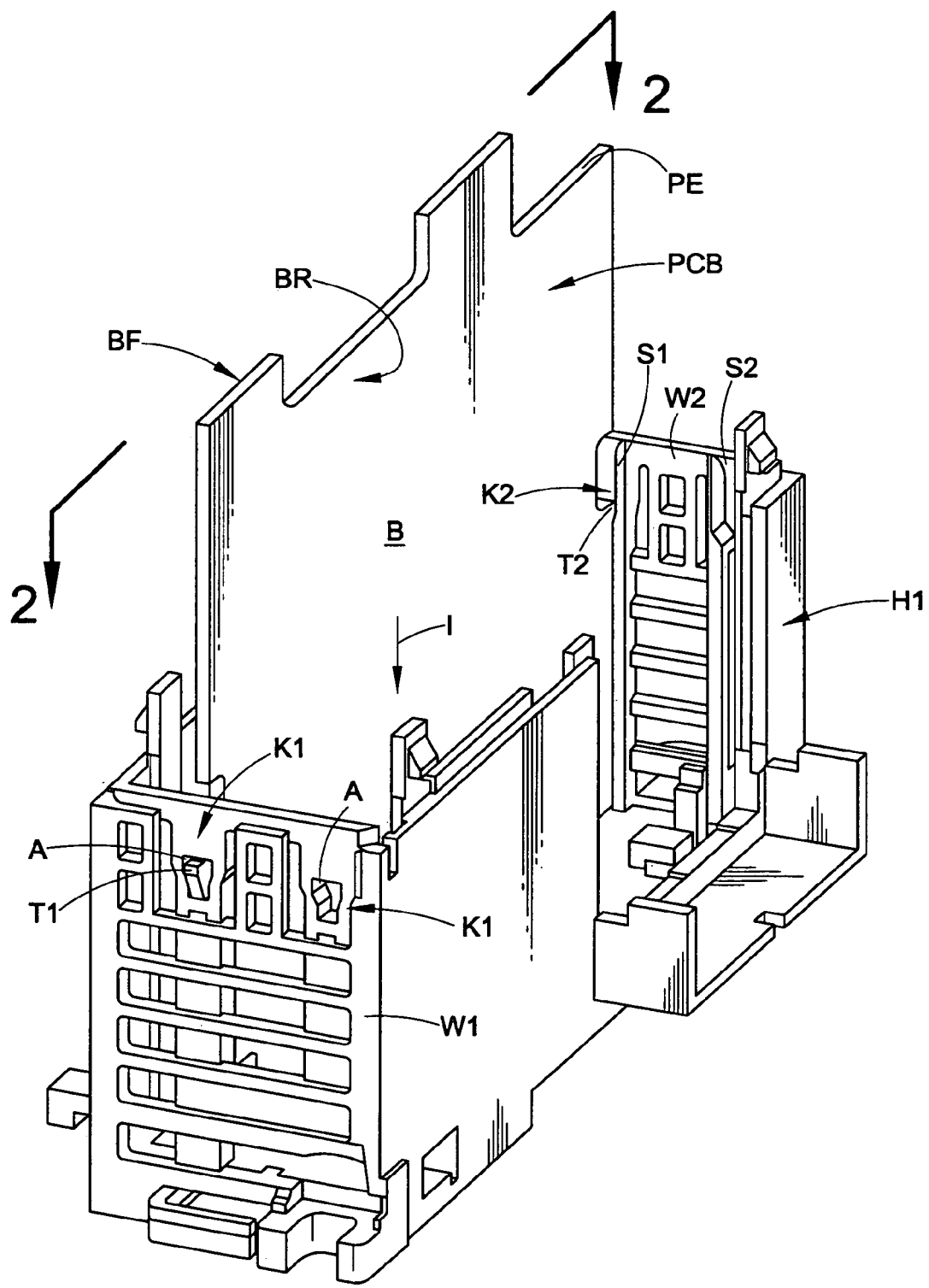
FIG. 1 is an isometric view of an enclosure housing portion and printed circuit board formed and assembled in accordance with the present development.

FIG. 1 illustrates a printed circuit board PCB and enclosure housing portion H1 both formed in accordance with the present development and assembled according to the present development. In a typical arrangement, the enclosure housing portion H1 is adapted to be connected to a mating housing portion (partially shown schematically at H2 in FIG. 3B) to enclose the printed circuit board PCB in a hollow interior space defined by the mated housing portions.

Figure 1A:
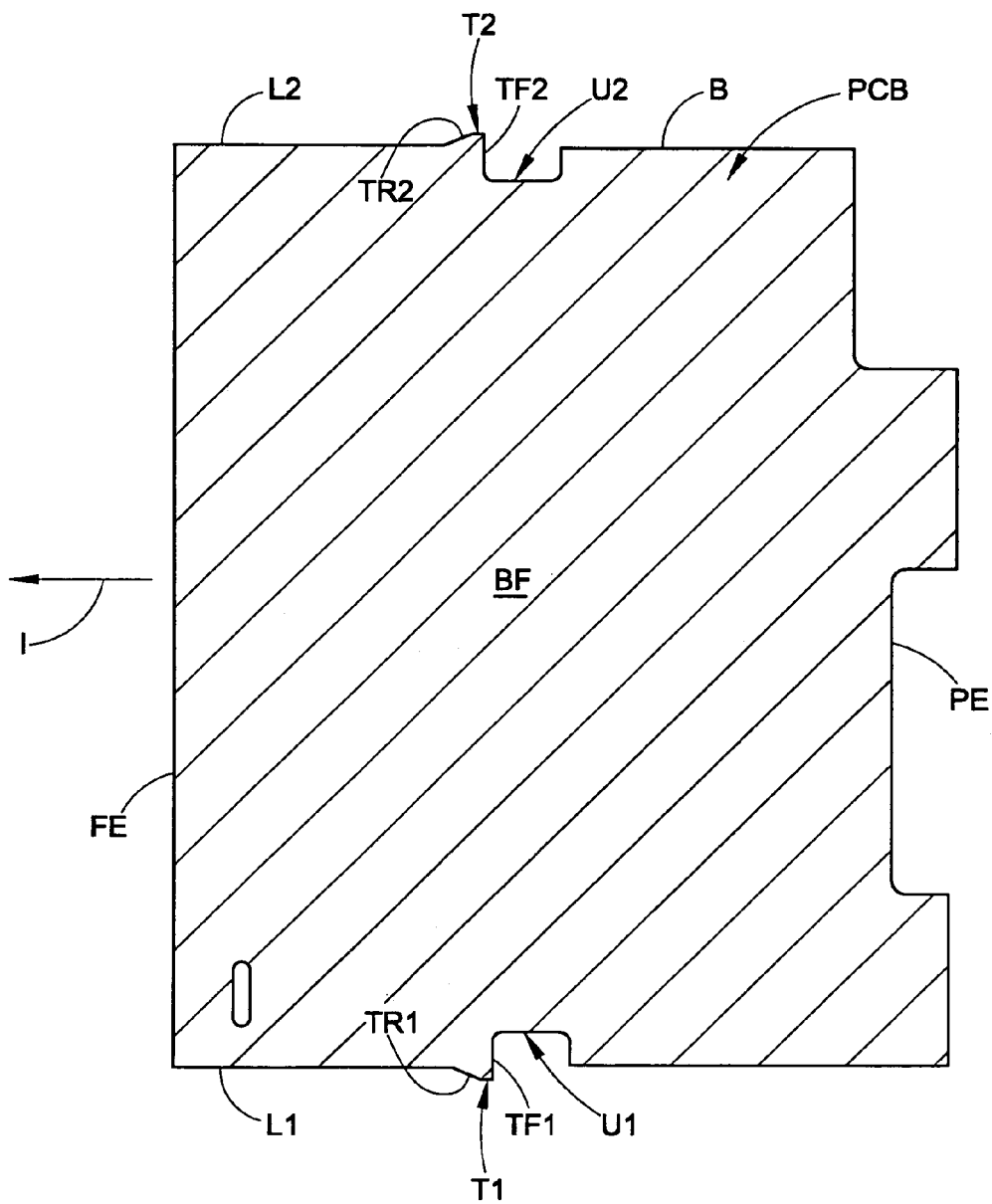
FIG. 1A shows the printed circuit board of FIG. 1.

Except as otherwise shown and/or described herein, the printed circuit board PCB, shown separately in FIG. 1A, is conventional in all respects and comprises an relatively thin planar board member B having a front face BF and an opposite rear face BR on which electronic components are mounted and interconnected by traces that are also applied to the front and rear faces (the electronic components and traces are not shown herein in order to simplify the drawings). The front and rear faces BF,BR each comprise a contiguous area that is defined by a peripheral edge PE of the board. Similar to conventional printed circuit boards, the peripheral edge is dimensioned and conformed to fit closely within an enclosure housing such as that defined by the housing portions H1,H2. Unlike conventional printed circuit boards, however, the printed circuit board PCB comprises at least one and preferably at least two protruding tabs T1,T2 that project outwardly from and partially define the peripheral edge PE. The one or more tabs T1,T2 extend within the plane of the board B.

With continuing reference to FIG. 1A, the board B comprises a front edge FE and is intended to be inserted slidably into the housing portion H1 in an insertion direction I that is parallel to the plane of the board (the term "front" is used to simplify understanding of the development and is not intended to be limiting in terms of orientation of the housing portion H1 or board B). To facilitate this insertion operation, the peripheral edge PE comprises first and second opposite lateral edges L1,L2 that lie parallel to each other and to the insertion direction I and that are preferably smooth and linear. The tabs T1,T2 are preferably located opposite and in alignment with each other and comprise respective ramp surfaces TR1,TR2 that blend into the lateral edges L1,L2 and that are inclined in a direction opposite the insertion direction I (moving away from the board front edge FE). The ramp surfaces TR1,TR2 are terminated by respective locking faces TF1,TF2 that extend transversely inward toward each other from the outer terminal ends of the ramp surface TR1,TR2. In the illustrated embodiment, the locking faces TF1,TF2 extend normal to the insertion direction I. In addition, it is preferred that the locking faces TF1,TF2 blend into and partially define respective undercuts U1,U2 located adjacent the tabs T1,T2, immediately outward therefrom in terms of the insertion direction I. The undercuts U1,U2 preferably extend toward each other laterally inward relative to the lateral surfaces L1,L2, respectively.

Figure 2:
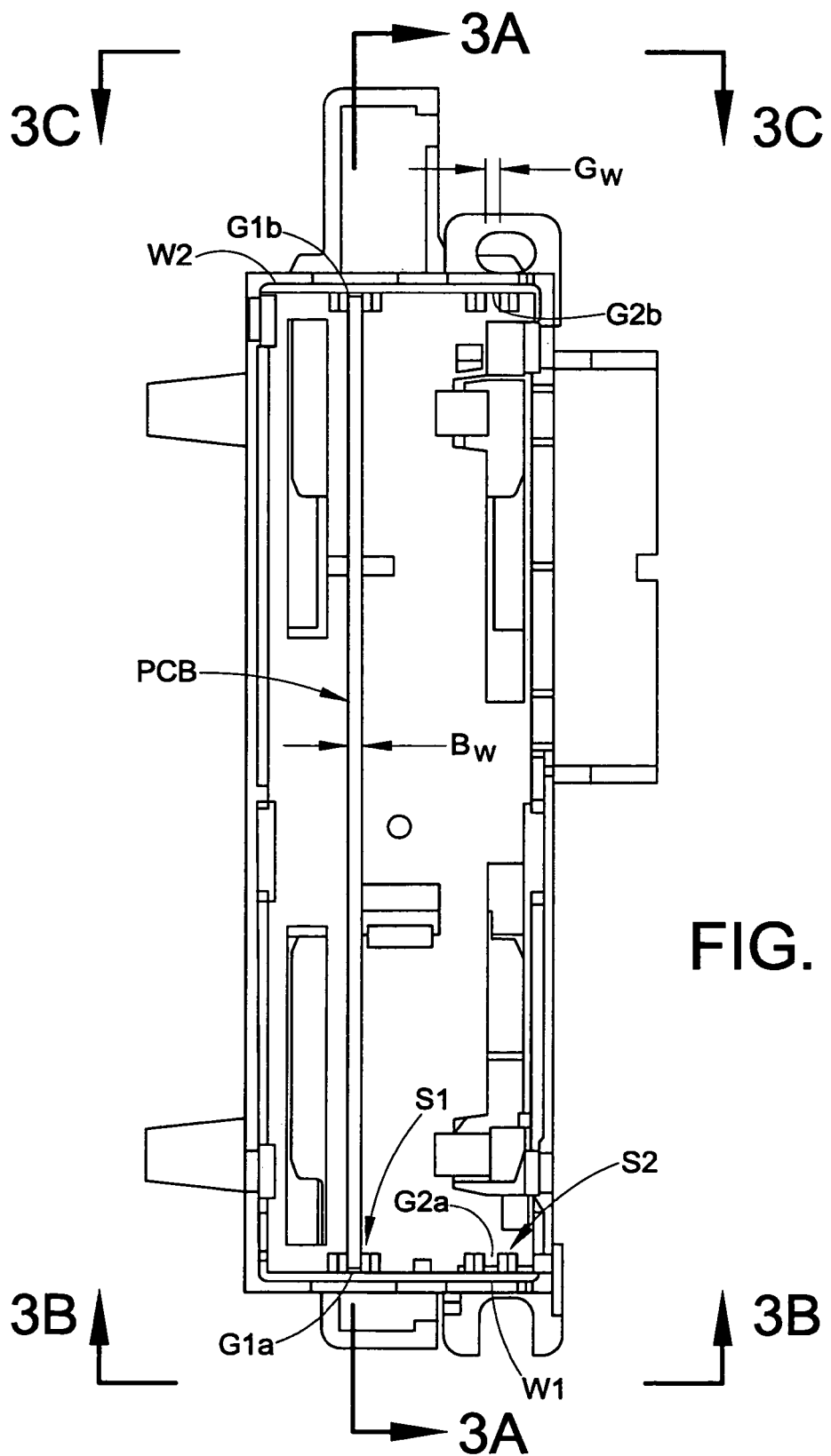
FIG. 2 is an elevational view of the printed circuit board and housing of FIG. 1 as taken along line 2—2 of FIG. 1.
Figure 3A:
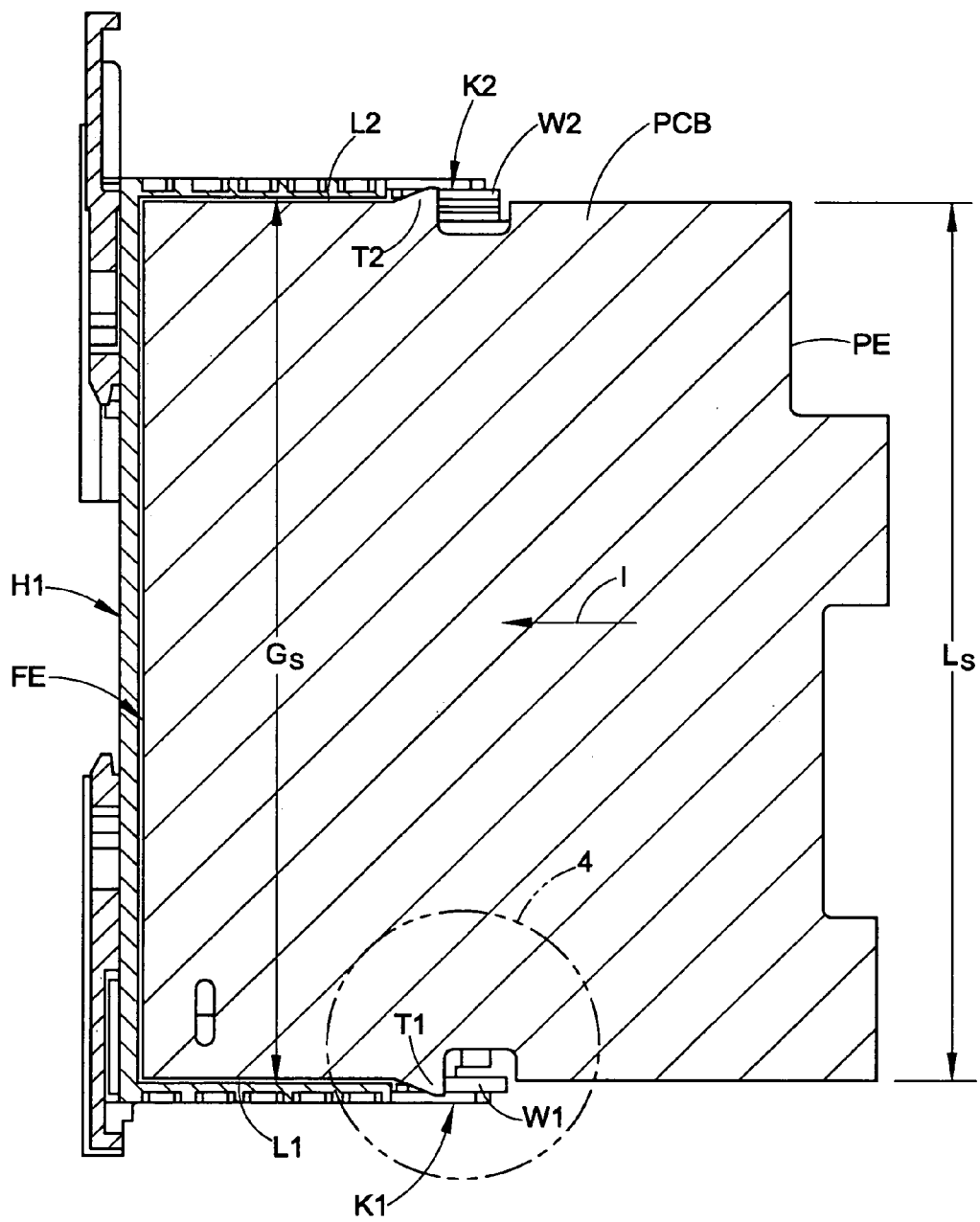
FIG. 3A is a section view taken along line 3A—3A of FIG. 2.
Figure 6:
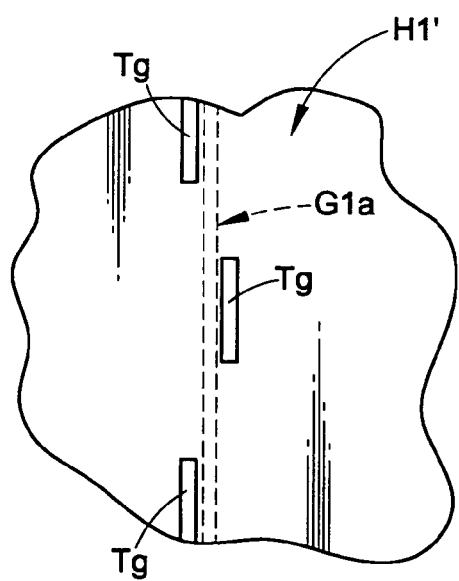
FIG. 6 shows an alternative embodiment for securing a circuit board against lateral movement.
Figure 7:
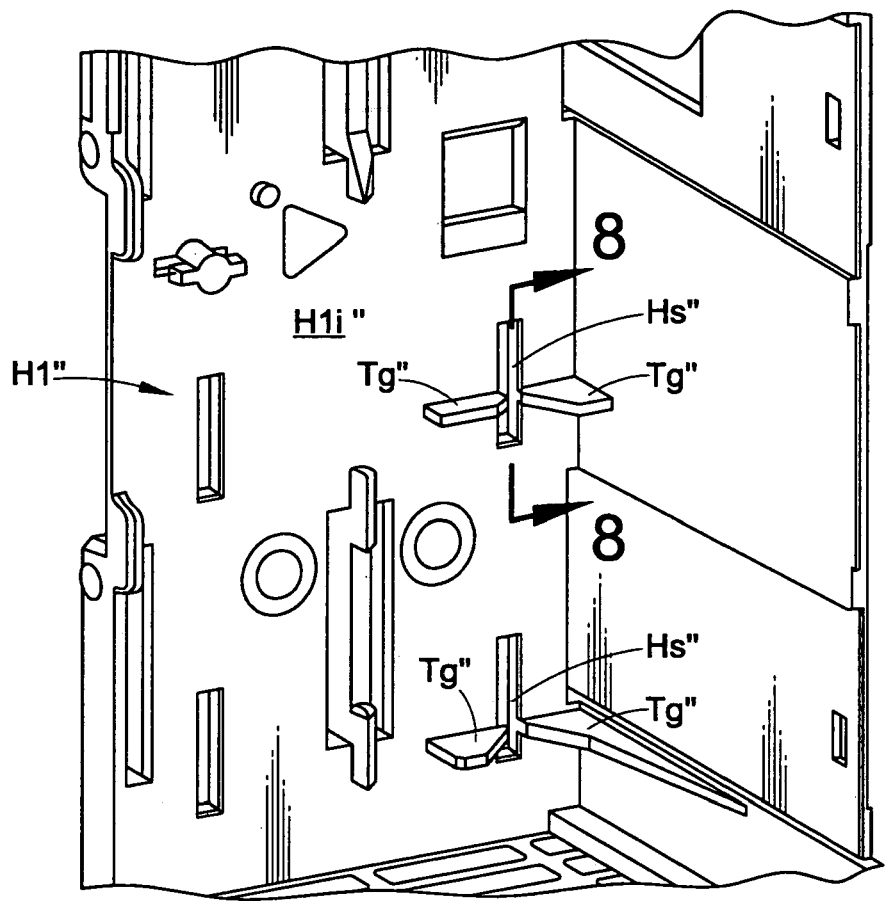
FIG. 7 partially shows another -alternative housing portion formed in accordance with the present development.
Figure 8:
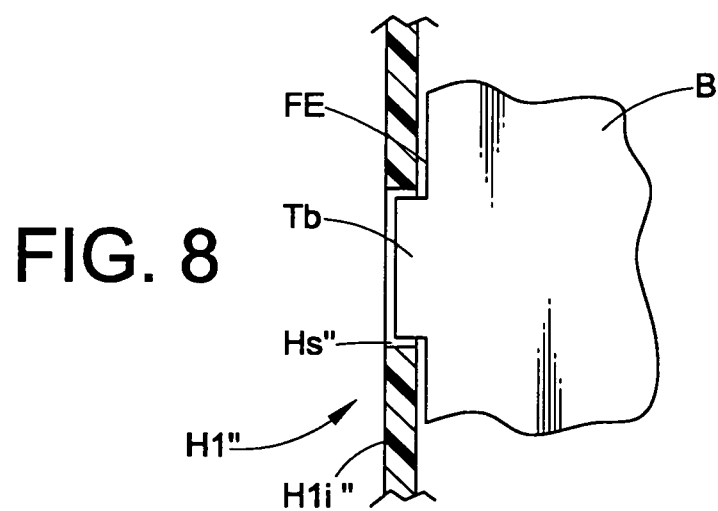
FIG. 8 is a sectional view of the housing portion of FIG. 7 taken along line 8—8 and showing an associated circuit board installed therein.

Referring now to both FIGS. 1 and 2, the housing portion H1 comprises at least one and typically multiple slots S1,S2, with each slot adapted to receive a printed circuit board PCB according to the present development (a board PCB is located in slot S1 but slot S2 is empty). As shown, the first slot S1 is defined by a first pair of opposed grooves G1a,G1b and a second slot S2 defined by a pair of opposed grooves G2a,G2b. In the illustrated embodiment, the grooves G1a, G1b,G2a,G2b are all identical to each other. The grooves G1a,G1b are aligned and lie parallel to each other, and the grooves G2a,G2b are aligned and lie parallel to each other so as to define the slots S1,S2 respectively therebetween for receiving a printed circuit board PCB with a close sliding fit. Each individual groove G1a,G1b,G2a,G2b preferably defines a width Gw (FIG. 2) that is minimally larger than a thickness Bw of the board B to be received therein to minimize movement of the board in opposite directions transverse to the insertion direction I and plane of the board. Also, as best seen in FIG. 3A, the grooves G1a,G1b (and also the grooves G2a,G2b) lie parallel and are spaced apart from each other a distance Gs that is minimally larger than the distance Ls defined between the board lateral edges L1,L2 so that the board B is closely received between the grooves G1a,G1b and is restrained against movement transverse to the insertion direction I and parallel to the plane of the board B. The grooves G1a,G1b need not be identical to each other and can vary in length. Also, the term "groove" is not intended to be limited to a continuous channel and can encompass any path that slidably receives the board B in the insertion direction I parallel to the plane of the board B and that prevents movement of the board transverse to the insertion direction. In another embodiment as shown in FIG. 6, the grooves G1a,G1b (only the groove G1a is shown) are defined as indicated by broken lines between a plurality of tabs Tg that project outwardly from an alternative housing portion H1'. Other arrangements are contemplated for inhibiting lateral or transverse movement of a board B relative to the insertion direction. FIG. 7 shows another alternative housing portion H1" wherein tabs Tg" project from an inner wall H1i" of the housing and are adapted to receive the front edge FE of board B therebetween. Also as shown in FIG. 7, the inner wall H1i" can include one or more slots Hs" for receiving a tab Tb (FIG. 8) that projects from front edge FE of board B.

The housing portion H1 comprises latches that are adapted to retained the board tabs T1,T2 to lock each board B into a slot S1 or S2. The number of latches used to retain each board B should preferably equal the number of tabs T1,T2 defined by the board B. In the illustrated embodiment, the board B comprises two tabs T1,T2 and, as such, the illustrated housing portion H1 comprises first and second latches K1,K2 (see FIG. 3A) associated with each slot S1,S2 to engage these tabs of the board, inserted therein.

The structure and operation of the latches K1,K2 (referred to generally as latches K) as illustrated herein can be understood with reference to FIGS. 1 and 3A. There, the latches K1 for the slots S1,S2 are shown (the latches K2 for the slots S1,S2 are preferably identical to the latches K1). Preferably, the housing portion H1 is defined as a molded polymeric structure and the latches K are defined as a one-piece construction therewith. Most preferably, as shown in FIGS. 1 and 3A, the housing portion H1 comprises opposite side walls W1,W2, and latches K1 are defined by the wall W1, preferably within the thickness thereof as shown, while the latches K2 are defined by the wall W2, preferably within the thickness of same. FIGS. 1, 3A, 3B and 3C show that each latch K comprises an aperture A defined in a respective wall W1,W2 and that is adapted to receive and retain a tab T1,T2. The apertures A are located within or at least in alignment with the grooves G1a,G1b,G2a,G2b. As the circuit board B is inserted into the slots S1,S2 in the direction I, the ramp surfaces TR1,TR2 engage the sidewalls W1,W2, respectively, and resiliently urge them apart from each other so that the tabs T1,T2 are able to slide in the slot S1 or S2. When the tabs T1,T2 encounter the apertures A of the latches K1,K2, respectively, they are received therein so that the sidewalls W1,W2 are able contract inwardly toward each other under their own resilient bias and resume their normal shape. The apertures A are dimensioned to be larger than the board width Bw to ensure that the tabs T1,T2 are readily received therein even if slightly misaligned. It is notable that the resilient characteristics of the molded polymeric walls W1,W2 are used to retain a board B therebetween, rather than known designs that rely on projecting snap-legs that are less robust. Furthermore, the walls W1,W2 cooperate with each other to retain a board B therebetween, with each wall W1,W2 acting inwardly toward the other to increase resistance to board dislodgement. It should also be noted that the grooves G1a,G2a are preferably defined by and as a one-piece construction with the wall W1, while the grooves G1b,G2b are preferably defined by and as a one-piece construction with the wall W2. Furthermore, it is highly desirable that the apertures A extend entirely through the respective walls W1,W2 in which they are defined so as to allow for a visual confirmation that the tabs T1,T2 are firmly seated therein.

Figure 4:
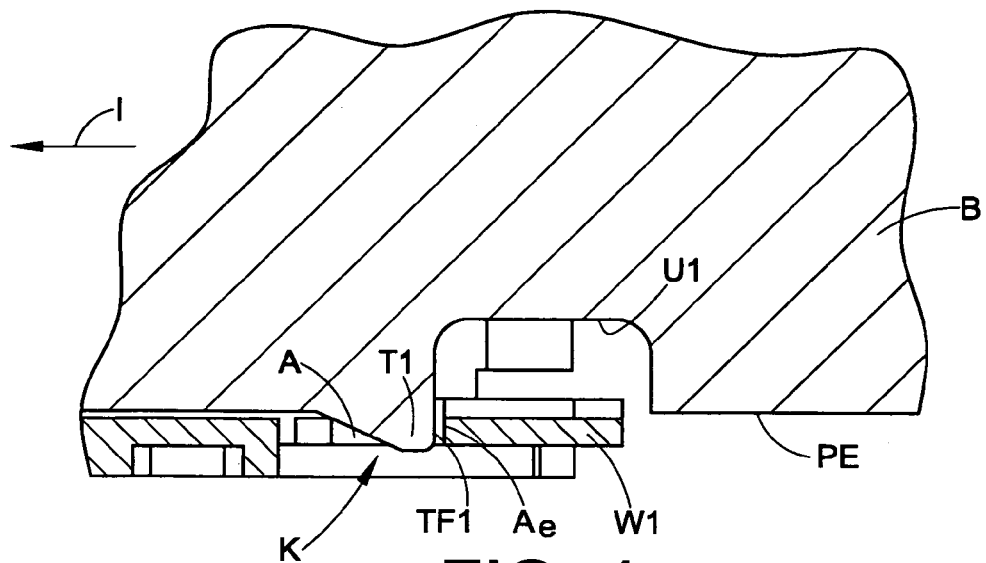
FIG. 4 is a greatly enlarged detail view of region 4 of FIG. 3A.
Figure 5:
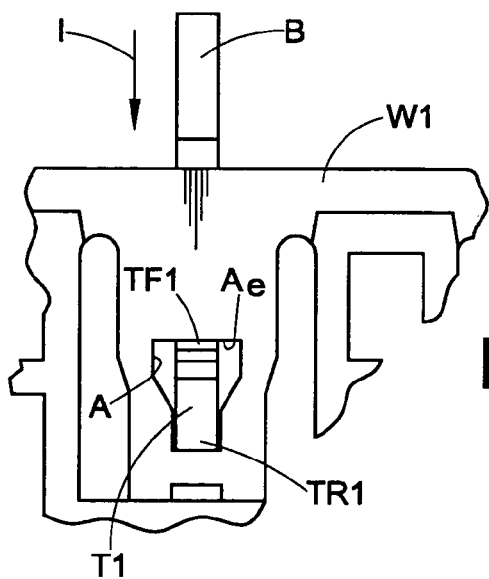
FIG. 5 is a greatly enlarged detail view of region 5 of FIG. 3B.

With particular reference to FIGS. 4 and 5 the aperture A of each latch K is partially defined by a locking edge Ae that is arranged transverse (preferably perpendicular) to the board insertion direction I and that abuts or lies very close to the locking face TF1,TF2 of the tabs T1,T2 received therein to prevent sliding movement of the board B in a direction opposite the insertion direction I once the tab T1,T2 is received in the aperture (inward movement of the board B in the insertion direction I is limited by abutment of the front edge Fe or other portion of the board B with the housing H1 so that the tabs T1,T2 are aligned with the apertures A of the latches K1,K2, respectively, when the board B is fully installed so as to prevent over-insertion of the board B). The presence of undercuts U1,U2 in the peripheral edge PE of the board B facilitate separation of an installed board B from the housing portion H1 in that the separation operation typically requires that a blade be inserted between each tab T1,T2 and the locking edge Ae of each aperture or otherwise between the housing wall W1,W2 and board B so that the wall can be deformed outwardly to release the captured tab T1,T2.

The invention has been described with reference to preferred embodiments. Modifications and alterations will occur to those of ordinary skill in the art, and it is intended that the claims be construed literally and/or according to the doctrine or equivalents to encompass all such modifications and alterations.

The invention claimed is:

1. An enclosure housing portion adapted to receive and retain a circuit board, said enclosure housing portion comprising:
   a first side wall;
   a first latch defined as a one-piece construction with said first side wall, said first latch comprising an aperture adapted to receive a first projecting tab of an associated circuit board inserted into said housing portion;
   a second side wall;
   a second latch defined as a one-piece construction with said second side wall, said second latch comprising an aperture adapted to receive a second projecting tab of an associated circuit board inserted into said housing portion;
   wherein said first and second side walls and said first and second latches are all defined together as a one-piece molded polymeric construction;
   said enclosure housing portion further comprising structures adapted to inhibit movement of the associated circuit board in a direction transverse to an insertion direction in which the associated circuit board is inserted into the enclosure housing portion.

2. The enclosure housing portion as set forth in claim 1, wherein said structures adapted to inhibit transverse movement comprise first and second grooves defined respectively by said first and second side walls, and wherein said aperture of said first latch is located in said first groove and said aperture of said second latch is located in said second groove.

3. The enclosure housing portion as set forth in claim 2, wherein:
   said first and second grooves extend in said board insertion direction;
   said aperture of said first latch is partially defined by a first locking edge arranged transverse to said board insertion direction and that engages a locking face of a first projecting tab of an associated circuit board inserted into said slot; and,
   said aperture of said second latch is partially defined by a second locking edge arranged transverse to said board insertion direction and that engages a locking face of a second projecting tab of an associated circuit board inserted into said slot.

4. The enclosure housing portion as set forth in claim 3, wherein said first and second latches are located in aligned opposed facing relation with each other.

5. A circuit board comprising:
   a planar board member defined by a peripheral edge, said peripheral edge comprising:
   a front edge;
   first and second spaced-apart lateral edges each connected to said front edge, wherein said first and second spaced-apart lateral edges extend transversely relative to said front edge;
   a first projecting tab defined by a first inclined ramp surface and a first locking face that terminates and lies transverse to said first inclined ramp surface, said first projecting tab projecting outwardly in a first direction from said first lateral edge;
   a second projecting tab defined by a second inclined ramp surface and a second locking face that terminates and lies transverse to said second inclined ramp surface, said second projecting tab projecting outwardly in a second direction from said second lateral edge;
   said first and second projecting tabs adapted for securing said planar board member in an associated housing without separate fasteners by engagement with respective first and second latches of the associated housing.

6. The circuit board as set forth in claim 5, wherein said first and second inclined ramp surfaces blend into said first and second lateral edges, respectively.

7. The circuit board as set forth in claim 6, wherein said first and second locking faces lie normal to said first and second lateral edges.

8. A circuit board comprising:
   a planar board member defined by a peripheral edge, said peripheral edge comprising:
   a front edge;
   first and second spaced-apart lateral edges that extend transversely relative to said front edge;
   a first projecting tab defined by a first inclined ramp surface and a first looking face that terminates and lies transverse to said first inclined ramp surface;
   a second projecting tab defined by a second inclined ramp surface and a second locking face that terminates and lies transverse to said second inclined ramp surface;
   said first and second projecting tabs adapted for securing said planar board member in an associated housing without separate fasteners by engagement with respective first and second latches of the associated housing;
   wherein said circuit board is installed in an enclosure housing portion, said enclosure housing portion comprising:
   a first side wall;
   a first latch defined as a one-piece construction with said first side wall, said first latch comprising a first aperture in which said first projecting tab is positioned;
   a second side wall;
   a second latch defined as a one-piece construction with said second side wall, said second latch comprising a second aperture in which said second projecting tab is positioned; and,
   wherein said first and second side walls of said enclosure housing portion further define respective first and second grooves that cooperate to define a slot therebetween, and wherein said circuit board is located in said slot with said first and second lateral edges thereof seated in said first and second grooves, respectively.

9. The circuit board as set forth in claim 8, wherein said first and second side walls and said first and second latches of said enclosure housing portion are all defined together as a one-piece molded polymeric construction.

10. The circuit board as set forth in claim 8, wherein said enclosure housing portion is defined with said first aperture located in said first groove and said second aperture located in said second groove.

11. The circuit board as set forth in claim 8, wherein:
   said first and second grooves extend in a board insertion direction;
   said aperture of said first latch is partially defined by a first looking edge arranged transverse to said board insertion direction and that engages a locking face of said first projecting tab of said circuit board; and,
   said aperture of said second latch is partially defined by a second locking edge arranged transverse to said board insertion direction and that engages a locking face of said second projecting tab of said circuit board.

12. An enclosure housing portion comprising:

a first side wall defined as a molded polymeric construction;

a first latch defined as a one-piece construction with said first side wall;

a second side wall defined as a molded polymeric construction;

a second latch defined as a one-piece construction with said second side wall;

a circuit board connected to said enclosure housing portion, said circuit board comprising a planar board member defined by a peripheral edge that outlines a plane of said circuit board, said peripheral edge comprising and defining: (i) a first projecting tab defined by a first inclined ramp surface and a first locking face that lies transverse to said first inclined ramp surface, wherein said first projecting tab is engaged with said first latch of said first side wall; and, (ii) a second projecting tab defined by a second inclined ramp surface and a second locking face that lies transverse to said second inclined ramp surface, wherein said second projecting tab is engaged with said second latch of said second side wall;

said enclosure housing portion comprising a structure that prevents movement of said circuit board in a direction transverse to said plane of said circuit board;

said circuit board adapted for selective disengagement from said enclosure housing portion by disengagement of said first and second latches and by sliding movement relative to said enclosure housing portion in a direction parallel to said plane of circuit board.

* * * * *